United States Patent [19]
Klein

[11] Patent Number: 5,063,520
[45] Date of Patent: Nov. 5, 1991

[54] COMPUTER AIDED PROCESS FOR NETWORK ANALYSIS

[76] Inventor: Dennis H. Klein, 347 Hazel Ave., Mill Valley, Calif. 94941

[21] Appl. No.: 549,066

[22] Filed: Jul. 6, 1990

[51] Int. Cl.[5] ............................................. G06F 15/60
[52] U.S. Cl. .................................................. 364/512
[58] Field of Search ................ 364/488, 512, 521, 578

[56] References Cited

U.S. PATENT DOCUMENTS

| | | | |
|---|---|---|---|
| 4,551,810 | 11/1985 | Levine | 364/512 |
| 4,831,546 | 5/1989 | Mitsua et al. | 364/512 |
| 4,964,056 | 10/1990 | Bekki et al. | 364/488 |

*Primary Examiner*—Salvatore Cangialosi
*Attorney, Agent, or Firm*—Oblon, Spivak, McClelland, Maier & Neusdtadt

[57] ABSTRACT

A unique method of network analysis using a personal computer in link with a computer aided drafting and design system (CADD) is described wherein the CADD serves as the platform for the computer implemented process of the present invention. This process involves first creating a graphic network, using a video terminal, inputting on the screen the various nodes and network connecting links. User identification numbers and entity handle numbers are assigned to each feature, the process of creating the graphic image and assigning identification features carried out node to link the node until the entire network has been drawn into the database. Thereafter, by selection of the proper prompt, the database can be queried for any node to highlight either nodes and links that flow to that node, or flow away therefrom. In order to speed up processing time where only a limited area of the network is of interest, the database can be broken down to a number of facets and the trace limited to the points located within the selected facets. Through the process of network checking, connectivity between the facets can easily be established to allow for rapid network analysis within the facets of interest.

20 Claims, 7 Drawing Sheets

COMPUTER AIDED PROCESS FOR NETWORK ANALYSIS

FIELD OF THE INVENTION

This invention relates to a unique method for network analysis such as in the case of complex sewer or electrical systems, and the like, with the aid of a personal computer.

BACKGROUND OF THE INVENTION

It is becoming increasingly important to be able to conduct fast and accurate analysis of network systems such as sewers, electrical, or telephone in order to be able to quickly locate breaks in these complex systems, and be able to shunt flow around these breaks to facilitate quick and safe repair. Thus, it is necessary in repairing an underground electrical cable system, for example, to be able to isolate the area of a break so that workers may safely engage in repair, while redirecting flow around the break so that service may continue uninterrupted. In the past, this was handled without computer assistance, by reference to complex network maps. While reference to these maps was generally reliable, the process of network tracing was often extremely time consuming and subject to drawing misinterpretation. Initial attempts at computer modeling and assistance in this type of analysis generally required complex calculations, which could only be run on mainframe computers. With the increasing power of today's personal computers, it has become possible to conduct a limited analysis on these computers. However, the programming for the type of complex analysis which generally involves several thousand or more network connections has continued to require the power of a mainframe.

OBJECTION OF THE INVENTION

It is an object of the invention to provide a computer-based system for complex network analysis which may be run on today's personal computers, which is simple to use, error free, economical to acquire, yet is able to accommodate the sophisticated processing needs of such a system.

It is a second objection of this invention to provide a computer-based network analysis system which incorporates a network checking feature, which allows the network display to be broken down into a multiplexity of facets, wherein limited portions of the network may be queried, without having to undergo an analysis of the entire system. The network checking feature establishes connectivity between the selected elements of the network from field display to adjacent field display, thus enabling a network trace within a selected array.

SUMMARY OF THE INVENTION

Figure 1:
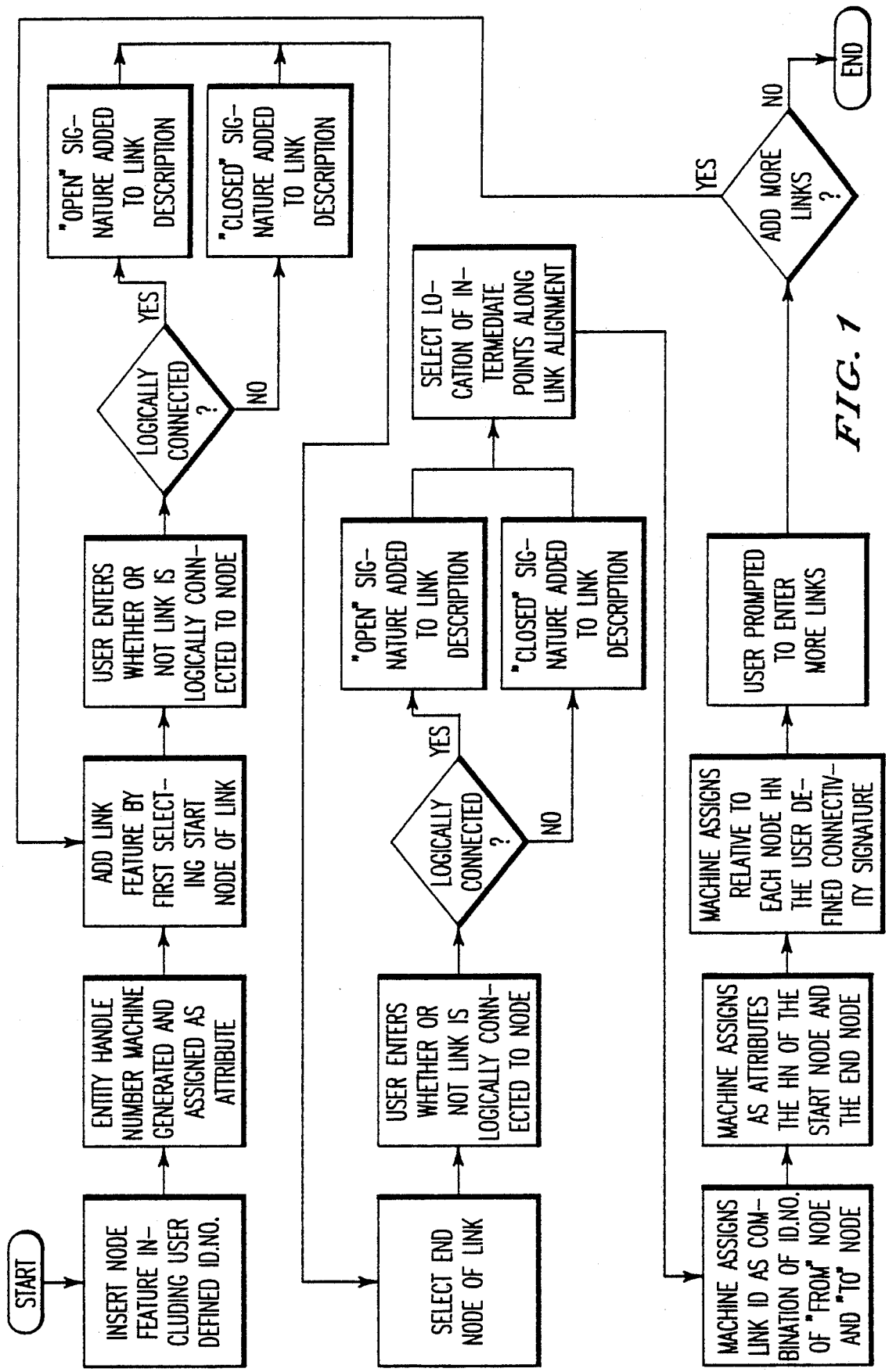
FIG. 1 is a flow diagram illustrating the logic employed by the present invention for establishing a connected network.

The present invention relates to the use of computer software to run a personal computer in a manner which enables the analysis of complex network relationships. More particularly, it allows one to query a network system to establish flow patterns through the system, and alternative routes for providing flow from one part of the system to the other. Such type of analysis if particularly useful, by way of example, in directing flow within sewer, storm drain, cable, and telephone systems. It also has utility in analysis of systems including steam lines, compressed air, cable, gas and the like. The application of the methods of this invention, however, are not limited to the type of system to be analyzed, but may broadly be used in the analysis of any network which is composed of a combination of links and connect points, where the connect points may be turned on or off, that is to the flow or no-flow direction.

The present invention utilizes the graphic display of a personal computer screen to illustrate the network system to be analyzed. Using just the display, the user may query any connect point or node within the network, and have the flow through that node to the terminus of the network graphically highlighted on the computer screen. By making a change at the connect point from open to closed, or closed to open, as might be done with a valve in a sewer system or an electric switch, the system may again be queried to determine the effect of the change on flow within the network. The results of the query are then illustrated on the computer screen by graphic highlighting of the new flow pattern. To visually observe the impact of a change upon the system, the displayed image may be moved to any point from the originally queried connect point to a point upstream or downstream. This may be done by either reducing the scale of the displayed image, if the up/downstream point of interest is not already displayed graphically, or panning the image in the up/downstream direction.

The network analysis program of this invention is platformed to a Computer Aided Drafting and Design System (CADD) such as sold by AutoCAD, DigiCAD, VersaCAD and others. These programs allow for the description of a point on a displayed screen as a function of its coordinates. In defining the network, which consists of a series of connect points (nodes) and lines (i.e., links), each connect point using CADD is assigned a unique machine readable entity handle number based on its display coordinates. The lines running between connect points are assigned a tag at their mid-point, or at the mid-point of the longest segment if composed of more than one segment, thus allowing the CADD system to likewise describe the link using a simple, uniquely assigned machine readable number.

The network is built up by graphically tracing on the computer screen its physical attributes, assigning connect points, and drawing in the lines between said points, on a repetitive basis until the entire network has been described. Thereafter, by the process of this invention, the network may be queried to determine its condition,, that is the direction of flow between various connect points through the linear components of the network.

When tracing a network, the computer through CADD interrogates all links physically connected to the selected connect point (node) and asks the following question: Which links have an "on" (0) position assigned to the end physically connected to the selected node. For each end that meets the test, the position setting assigned to the other end of the link is interrogated. For each end that passes both tests, the connect node at the far end is subject to the same test as the selected node. This process is repeated until all possible qualifying links and nodes are identified. Once this has been accomplished, all such nodes and links are graphically highlighted. In addition, a list of the Entity Handle Numbers of each graphic object that makes up the trace is written into a ASCII text file for subsequent analytical use. All of the above-mentioned network tracing operations are performed by the system of this invention completely within the CADD resident graphic database

DETAILED DESCRIPTION OF THE INVENTION

The first step in performing the network analysis of this invention is to graphically create the database depicting the network of interest. To do this, the user must obtain a generic graphic package. A particularly suitable one is marketed by Autocad, though other systems may be useable where the program is capable of automatically assigning a machine readable number to a graphic object as it is created. Generally, these graphic databases are constructed using existing drawings and a Mouse or a tablet to recreate the graphic object on screen. The process logic is illustrated in FIG. 1. The connect or node points are installed first. These node points constitute the control devices such as switches, or valves which determine whether flow or no flow occurs across the connect point. In each step of creating the graphic database, the connect point is positioned, and then entered, establishing an XY machine readable coordinate for that point. The coordinate for the point is added to the CADD database and assigned a unique entity handle number.

In graphically recreating on the computer display a copy of an existing or proposed network, each of the connect nodes are entered on the screen. It is not essential that all connect nodes be encoded first, but in common practice, several nodes are initially located within the model prior to using the nodes as end points for attaching the various network links.

The graphic database allows for the assignment of various pieces of information to each of the created points. Using the Autocad system, this information is added in association with the connect point by way of visual prompts. Using a cursor, connect node features are entered into the CADD drawing with a MACRO that prompts the user to enter a unique ID number for each connect node. The MACRO automatically assigns as a pointer attribute to the connect node the entity handle number (HN) of the symbol that represents the connect node in the CADD drawing. The user may also select a category to describe the connect point such as a sewer valve or electronic switch. The scale of the symbol can be defined as well as its type, size, its orientation, and any other data which the user wishes to entered. When one returns to any particular connect node wherein a HN has been established, the machine will automatically associate that HN with data previously imputed.

The operator can place additional design information into the database for each HN. Such design information can include last inspection date, installation date, pressure rating, flow capacity, etc. If the operator wishes to do analysis of flows through the system, this can easily be accomplished using other, separate software commonly available. In operation, one can retrieve any of the imputed information associated with a connect node by bringing the cursor to that point on the screen.

Figure 4:
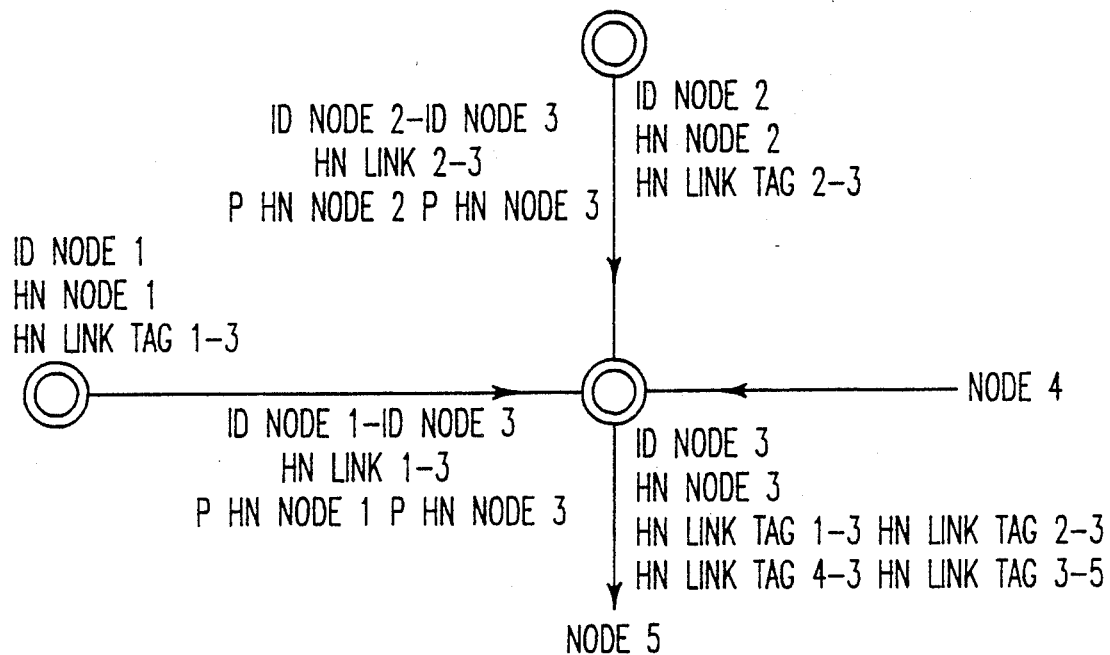
FIG. 4 is an illustration of the basic structure of a graphic display of a network according to the invention.

Once the connect points have been entered onto the screen, the operator creates the links between the points using the graphic program. A link is encoded by first selecting the node at the starting point of the link. The user is prompted to enter whether the link is logically connected or not. According to the answer, a connectivity signature indicating an on or off relationship between the link and the first connect node is written into the pointer attribute on the link tag. The connect node at the end of the link is then selected by the user. The user is prompted to enter whether the link is logically connected or not. According to the answer provided, a connectivity signature indicating an on or off relationship between the link and the end connect node is written into the pointer attribute on the link tag. The user is then prompted to select turning points along the alignment of the link. This prompt is ignored if the segment is a straight path between the two points. Otherwise, using a cursor, the location of intermediate points along the link's alignment are selected. The link is then automatically defined by the CADD graphic software and an attribute tag is automatically inserted on the link at the mid-point of the longest segment of the link. This tag contains attributes, as shown in FIG. 4, of an ID number, equal to the ID number of the node at its start point and the ID number of the node at its end point. In addition, the HN of the connect node at the start point and the end point is written as two individual point attributes onto the link tag along with the connectivity signature, ether one ("1") or zero ("0") as a prefix to their respective HN values. The user is prompted to enter another link. If he/she does, the process begins again. If not, the process ends. As with the connect nodes, the user can also place additional information about the link into the link tag. As a matter of convenience, in the program of the instant invention, if no instruction is given as to the condition of the node-link connection, the "on" position setting node is automatically selected.

In using the CADD graphic package, one may draw in as explained above connecting links which are other than straight lines between connect points. Thus, intermediate points can be selected to create bends in connecting links to more nearly approximate the actual physical structure of the network. The computer then creates a physical representation of the links being created drawing in and assigning at the mid-point of the longest segment the link tag which contains its unique HN and ID number. Thus incorporated into the database is the necessary information which describes the nodes to which a link is connected.

The map is built up by repeating these steps until the network has been completely described. This can be done for a system with 100, 1000, or 10,000 connect nodes. In creating the map, it is preferred but not required that the drawing process should be conducted as the same scale so that the network features remain consistent throughout.

As can be seen in FIG. 4, the network can be as simple as a few valves and connecting links or hundreds of valves with a similar number of connected links. In creating the graphic illustrated, the user would first place the crosshairs of the mouse, if a mouse were being used, to the selected location of the node of interest and enter both the plot point and the ID number. The entity handle number automatically assigned by the computer would be NH Node 1. Nodes 2, 3, 4 and 5 (not shown) would be similarly created. The links are then created as described above, and defined in terms of their connect points such as to node 1 and node 3. The position setting would be entered showing an open condition between the connect points if the link were in fact open. Similar lines would be created connecting node 2 to node 3 and node 4 to node 3, etc. In creating the links, a from-to ID number is automatically assigned to the link. It is a combination of the user defined number of the connect point from which the link emanates and the ID number of the node to which it terminates.

The CADD database assigns an entry handle number to the graphic object which represents the links and an entry handle number for the two connect nodes to which it is connected. It also records the position setting of the end point of the link relative to the point to which it is connected. A "1" means that the position setting is on, that is the link is both logically and physically connected to the connect node. Flow will thus occur through this valve or switch. A "0" means that the position setting is off. The link is physically connected to the connect node but not logically connected. Flow will not occur through the valve or switch in the closed position.

This pointer information provides all the information that is needed to completely describe a network of links regardless of the complexity of the utility network to which it belongs. The resulting network tracing model so constructed using connectivity operates entirely within the CADD graphic model. A supporting non-graphic data-base is not required to facilitate encoding or subsequent tracing capabilities in any way.

Figure 5:
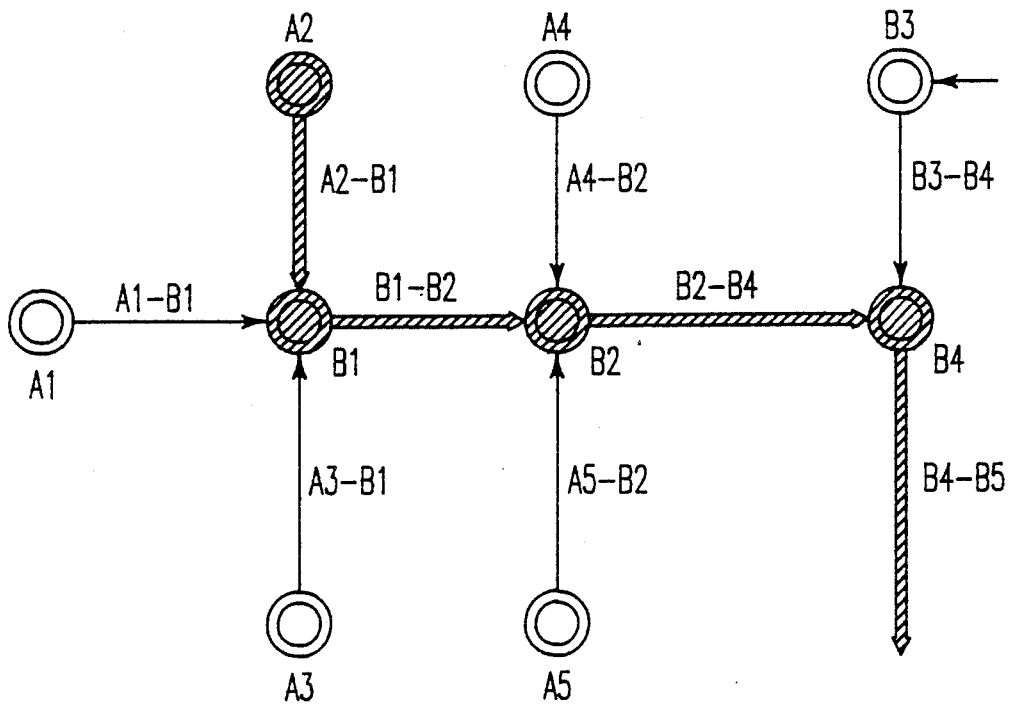
FIGS. 5-7 illustrate network tracings, and network change displays according to the invention.

One is now ready, with the database so constructed, to engage in network tracing in either the up or down direction. This is illustrated with reference to FIGS. 5 and 6. In the system shown, FIG. 5, if one wished to obtain a network trace for the flow through any one connect point, one would merely query that point. In the illustration, node A2 has been selected for tracing. By selecting that position using the mouse, the graphic program will automatically query itself, go through analysis of the connect points using the entry handle numbers and then trace out by highlighting on the screen the nodes and links which are logically connected throughout the system, as illustrated. In this process, the supporting CADD database interrogates itself to determine what are the connect points, first defining all of the physical connections within the system and then queries as to whether the elements are logically connected, that is whether the links are in an "on" or "off" position. It interrogates from the start point in all directions from link to node to link to the end of the network. Once the inquiry is completed, the logically connected components of the network light up.

Figure 6:
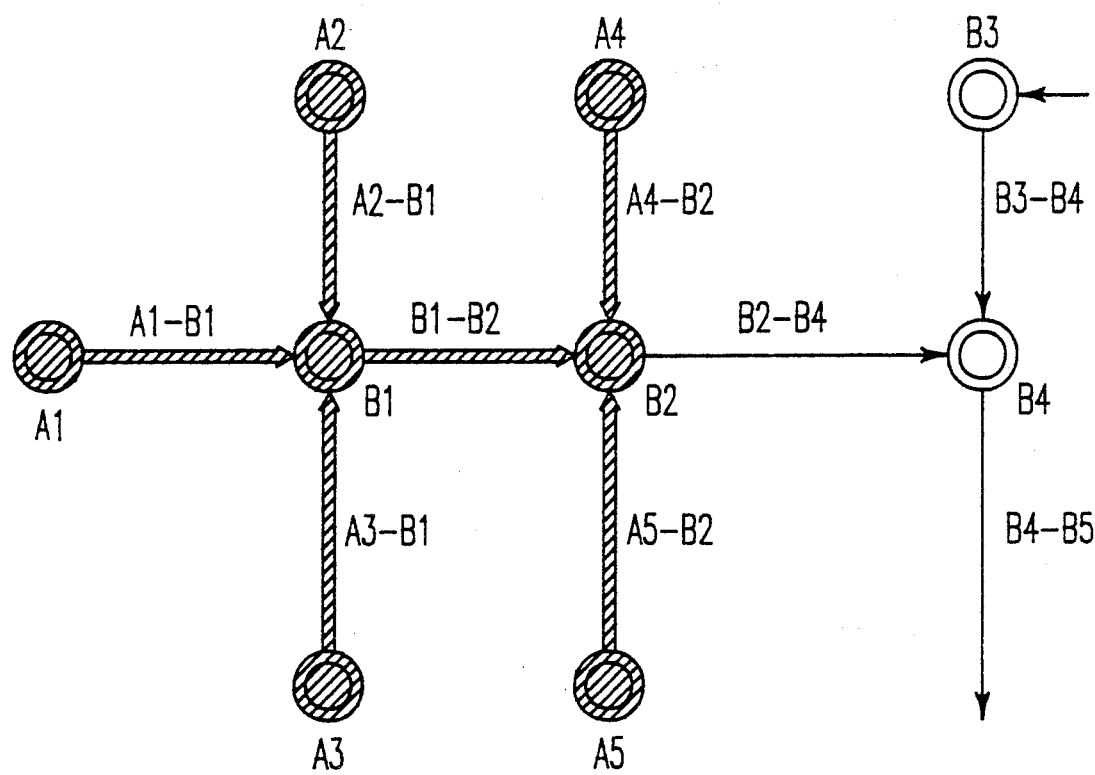

One may trace either up or down as desired by merely prompting the program accordingly. The impact on the graphic representation is illustrated in FIG. 6 which is identical to FIG. 5 except that B2 was selected as the trace point rather than A2. The trace highlights the direction of flow to 2.

Figure 7A:
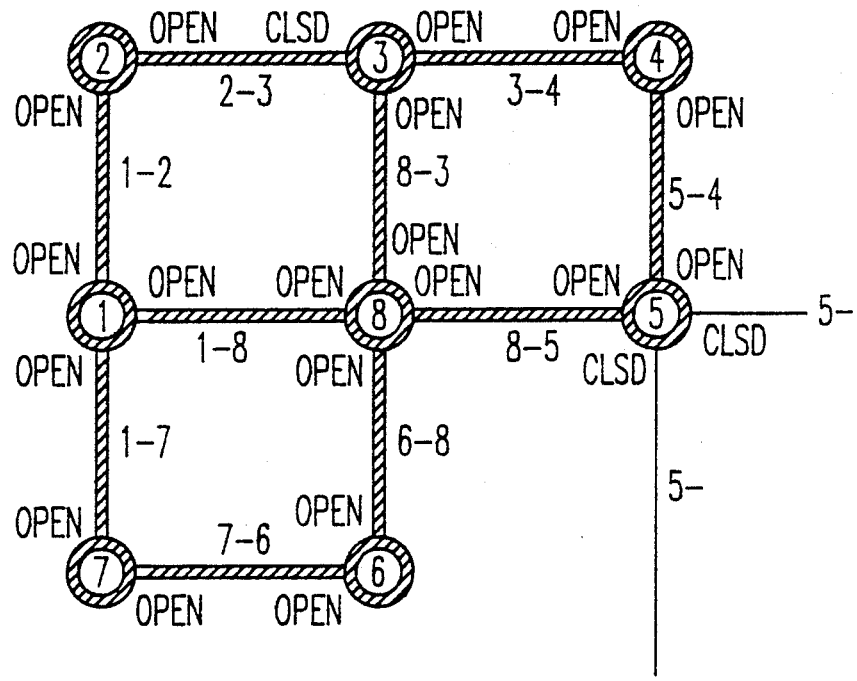
Figure 7B:
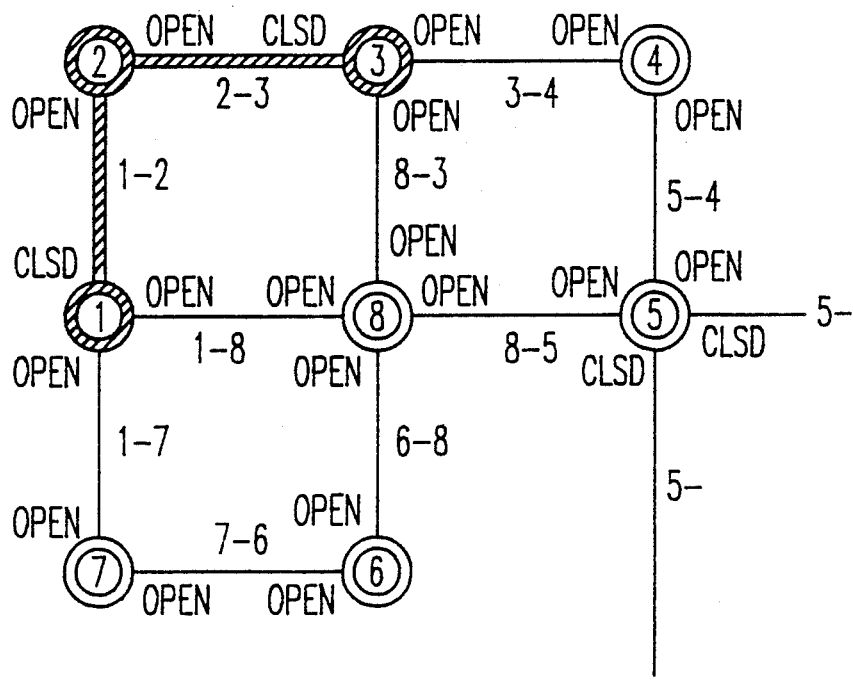

To determine the impact of changing a routing through the system, or bypassing a connect point, one can change the logic of any link from either closed to open or open to closed. To immediately view the impact of such change, one need merely query the node points adjacent the changed link to determine the impact of the change on the network. This is illustrated in FIG. 7 wherein as shown in 7A, all of the nodes are logically connected and light up accordingly. In 7B, connect node 1 is closed. Thus by again interrogating node 2 to identify the network features, the trace is limited to the highlighted links and nodes.

Figure 2A:
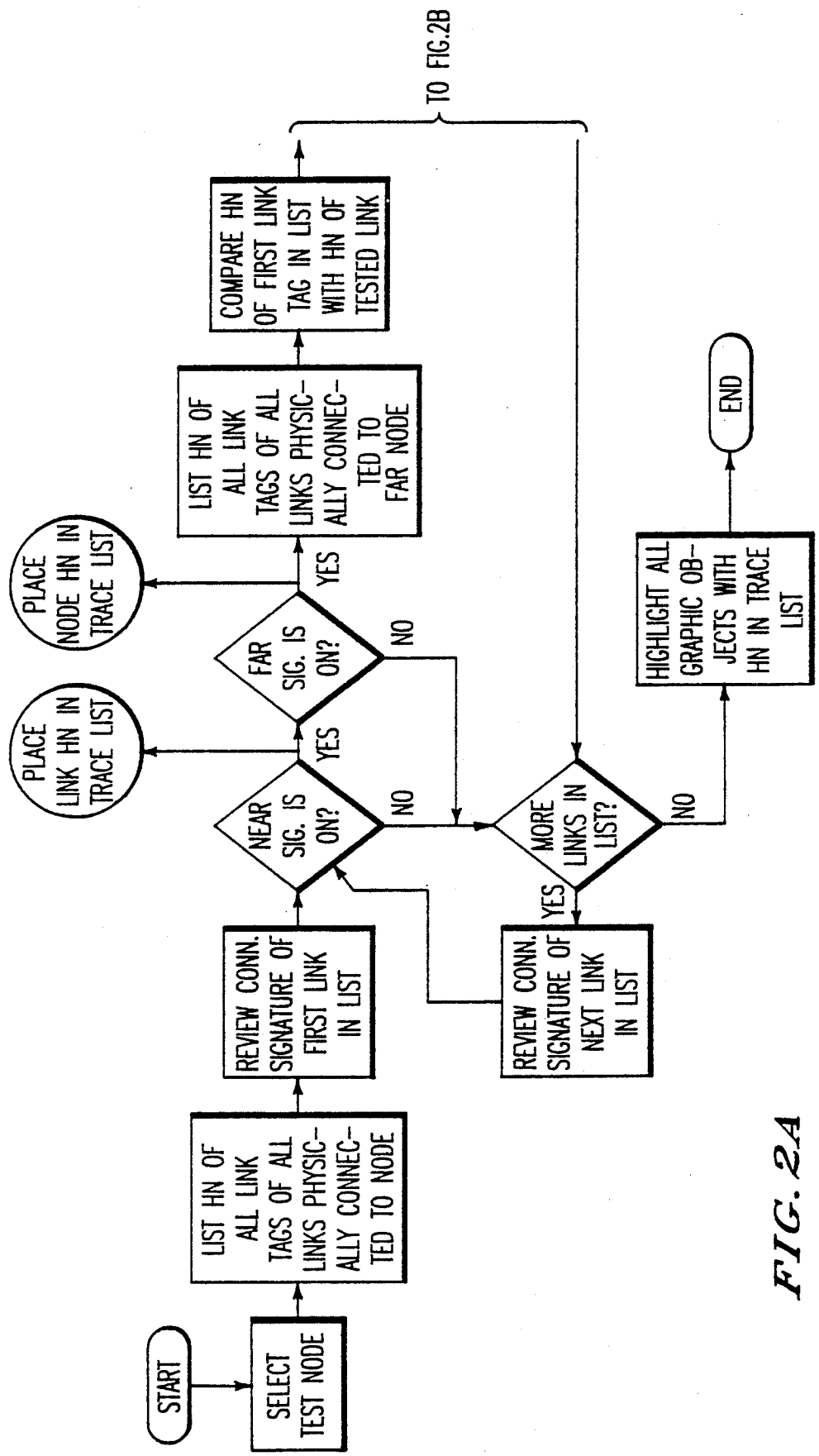
FIG. 2 is a flow diagram illustrating the network logic employed in performing a trace of a connected path within an established network.
Figure 2B:
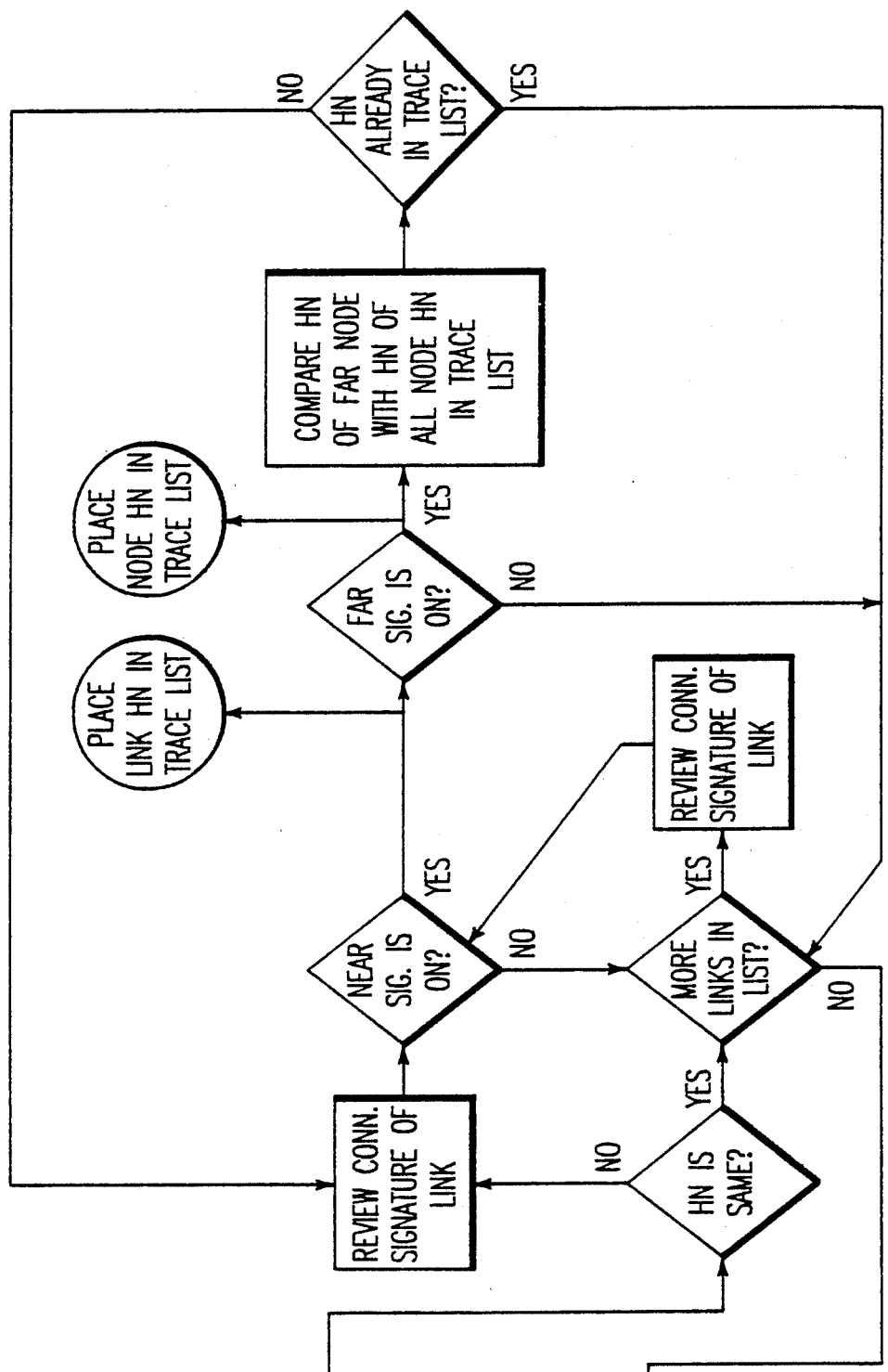

The program logic of the network trace is illustrated in FIG. 2. There it can be seen that as links and nodes are interrogated, a trace list is created of all connected links and nodes. Once the network has been fully interrogated, all graphic objects within the trace list become color highlighted.

As indicated earlier, a second object of the invention is to be able to establish connectivity between various segments of a network. The connectivity, i.e., network link is an outgrowth of the need to reduce the size of the network being interrogated and to substantially cut down on regeneration process time, as will be hereinafter more fully explained.

In constructing the network maps used to describe an interconnected array, the user will often input thousands of nodes and links. Having done so and indicating their present condition, that is on or off, the user is ready to make inquiry of the graphic database to trace out selected linkages. One of the problems with such large systems resides in the time it takes for the program to go through its logic before highlighting. The larger and more complex the system, the longer it takes to execute the logic sequence. Another problem resides in the time it takes for the graphic display to regenerate (i.e., repeat) after the display parameters have been changed such as by moving side-to-side or zooming in and out.

Both problems are addressed by the network checking feature of the invention, which allows the network to be broken down to small areas, that is, fields or facets which are established in side-by-side relationship, in quilt-like fashion and then reconnected. These facets define a limited area wherein each of the nodes and links have their own unique entry handle number. By way of example, if a city were divided into 10,000 square blocks and each block were segmented as a facet, then one could query a single block at a time. In the 10,000 square block example, a user could also inquire as to the affect of a change in block one on the immediately adjacent blocks, a 9-block field which could be checked and highlighted in a small fraction of the time it would otherwise take to highlight the entire system. It is also possible to further limit the scope of inquiry by the user employing a cursor to place a window around the area of interest, which area may only partially encompass an adjacent field. In this case, both the network checking operation and subsequent analysis is limited to the windowed area.

Figure 3:
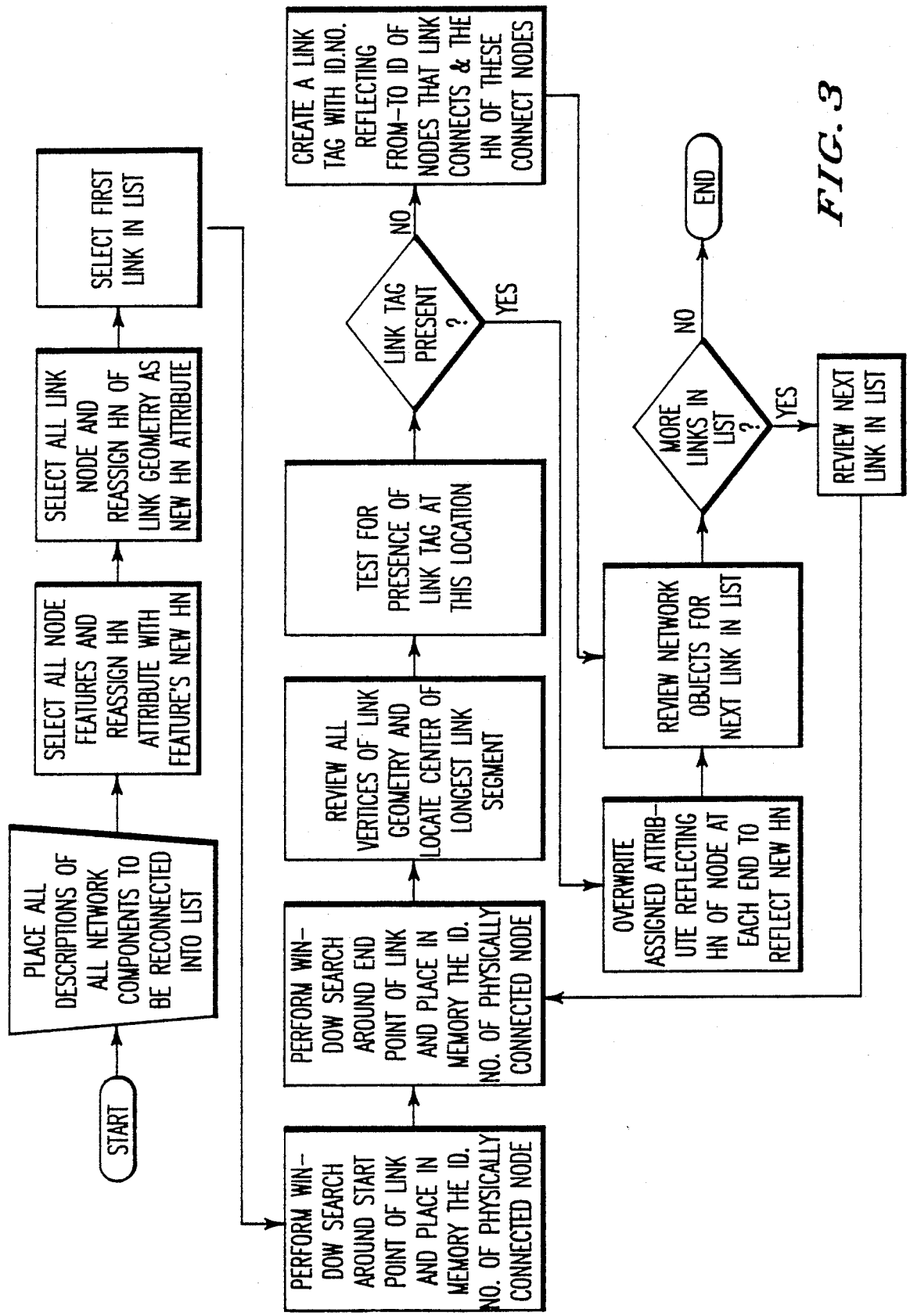
FIG. 3 is a flow diagram of the logic system employed in network checking, wherein connectivity is established within a corrupted or non-connected network.

The logic of network checking will now be discussed with reference to FIG. 3. The first step, as described heretofore, is the creation of the individual facets. In the process of creating each facet, ascending hexadecimal numbers are automatically assigned to the CADD graphic objects upon their creation in the graphic database, starting with the number 1 for the first object. An identification Number for each connect node in a connected network is also assigned by the user. Within each facet, as it is created, the first object will be assigned the number one, regardless of the user ID number assigned.

The next step is the selection of network facets to be reconnected into a list. This is done by using the mouse to place a window around the areas of interest, regardless of whether the window stops at a facet boundary or some intermediate point. The program then automatically, beginning with the first numbered facets, reassigns the machine readable, ascending hexadecimal numbers one to the other so they are continuous within the selected facets. Thus, if two facets had 5 nodes each, where within each facet the entry handle numbers ranged from 1 to 5, upon connection the HN numbers of the nodes of the second facet would be increased by 5, so that 1 would become 6, 2 would become 7 and so on. Thus, for example, the HN link 1-3 of FIG. 2 would become HN link 6-8.

In practice, the user, after defining the facets and the computer having reassigned all link and node numbers, selects a link as a start point. The computer then performs a window search around the start point of the link and places into its memory the ID number of the physically connected node. Next performed is a window search around the end point of the link and the ID number of the physically connected node is placed in the program memory. The vertices of the links are then interrogated to find the mid-point of the longest segment. A window search is now conducted around this mid-point to check for the presence of the link tag. If a tag is found, the next step is begun. If a tag is not found, a new one is automatically inserted, with an ID number assigned equal to the combination of the ID number assigned to the connect nodes at each end of the link.

If a link tag is found, then the pointer handles that reference the link to each of its end points are reassigned to be equal to new handle numbers currently assigned to the connect nodes at each end of the link. The connectivity prefixes which indicate the on or open position (1) or closed position (0), remain unaltered. The process continues, checking to see if there are more links in the list. If yes, the next link on the list is processed. If not, the process ends. Having thus reassigned all HN node and HN link numbers, a query limited to the windowed facets can now be performed in the usual fashion.

It will be apparent that connectivity can also be used to build composite maps of individual but connected graphic files. In this fashion, as systems expand and formerly isolated areas become logically connected, they can readily be consolidated into an overall graphic database.

Lastly, the network checking feature is essential where the integrity of a connected network becomes corrupted such as where one map or schematic is inserted inside of an active drawing. This results from the fact that the entity handle numbers are assigned as ascending hexadecimal numbers when objects are added to the CADD database. The network checking feature reconciles the differences between the newly entered machine generated handle numbers and the existing numbers of the previously defined graphic data base

DEFINITIONS

As used herein, the terms in the description and the appended claims have been assigned the definitions as set forth below:

Connect Node: A point in the network to which one or more links are connected. These graphic objects are CADD BLOCKS (symbols).

Link: A vector that connects any two nodes. These graphic objects are CADD PLINES (a straight line or multi-vertex line strings).

Link Tag: A CADD BLOCk placed On a network link that contains attribute definitions for maintaining machine readable information regarding the unique from-to ID number of the link, HN of the connect node at each end of the link, and the position setting, i.e., connectivity signature, of each end of the link.

Entity Handle Number (HN): Ascending hexadecimal numbers automatically associated with CADD graphic objects upon their creation in the graphic database.

Physical Connection: If the end point of a link is located at the insert point of a connect node, it is physically connected to that connect node.

Logical Connection: If the position setting of a link physically connected to a connect node is defined as "on" relative to that connect node, then this link is also logically connected to that connect node.

ID Number: User assigned attribute defining a unique identification number to each connect node in a connected network.

Pointer Attributes: Textual information associated with a graphic object in a network that describes its positional and operational relationship with the components to which it is physically connected.

Position Setting: A user defined pointer attribute describing the logical relationship of the end point of a link with the node to which it is physically connected.

Connectivity Signature: When a node at one or the other end of the link is logically connected to the link (position setting is on), a numeric "1" is written as a prefix to the HN of that connect node as part of the pointer attribute written on the link tag of that link. When it is off, a "0" is written.

Looping Network: A non-branching network driven by the position settings assigned to each end of each connecting link.

Primitive Object: In CADD, some graphic features are referred to as "primitives" due to their simple nature. Such primitives include points, lines, arcs, circles, line strings (PLINES) and symbols (BLOCKS). Therefore each node and link is a primitive, albeit the symbols do include attribute definition "slots" for holding pointer information.

Connectivity: The name of the network tracing technique of the invention.

Network Analysis: The name of the network tracing technique of this invention which allows for the establishment of connectivity between adjacent facets within a graphic database.

Trace List: A list generated by the network tracing process that contains a list of the handle numbers of each connect node and link that is logically connected to the selected connect node.

Highlight: Once the network tracing process is completed, each and every object that has its HN written into the trace list is color highlighted.

As can be seen from the above, the systems of this invention provide a powerful tool, bringing to operation managers the ability to simulate network operations, isolate specific components of the network, and support emergency responses thereto. The system also allows for shut down of various components of the network to allow for re-routing, facilitating scheduled maintenance of the system. In the case of an emergency repair such as where a gas line has broken, the system can assist in analysis of the break points. By customer reports where service has been interrupted, this information can be entered into the database and eventually by tracing up and down the network, the break point can be located. Gas lines may also be deactivated and service re-routed around the break point. Using this system, one can also more easily determine the impact of new additions to the system such as the impact of new buildings on an existing network.

What is claimed is:

1. A process for the creation of a graphic network display within a computer system containing a video display, comprising the steps of:
   (a) inserting a node feature onto a graphic display, and assigning a user ID number to the feature;
   (b) assigning a machine readable entity handle number to the inserted node feature;
   (c) inserting additional node features into said graphic display, and assigning both user ID numbers and machine readable entity handle numbers to each of the inserted features
   (d) adding linking features between and connecting the inserted nodes;
   (e) selecting the start node of a link and entering the connectivity condition, either open or closed of the node to link connection;
   (f) selecting the end node of a link and entering its connectivity conditions, either open or closed;
   (g) selecting an intermediate point along a link alignment and assigning a link user ID number, and attributes to that point;
   (h) automatically assigning an entity handle number to intermediate point;
   (i) repeating steps (a) through (h) until the network is graphically completely described.

2. The process of claim 1 wherein the machine readable entity handle numbers is an ascending hexadecimal number automatically assigned upon the creation of the object in the graphic database.

3. The process of claim 1 wherein the connectivity condition is assigned the value of "1" for the open condition and "0 for the closed condition.

4. The process of claim 1 wherein the connectivity condition is automatically entered as open unless otherwise changed by the user.

5. The process of claim 1 wherein for a link of a single segment, an attribute tag is automatically assigned by the CADD graphic software to the mid-point of the link 6. The process of claim 1 wherein the connecting links may be segmented, and an attribute tag automatically assigned by the CADD graphic software at the mid-point of the longest segment of the link.

7. The process of claim 1 wherein a computer aided drafting and design system is used as a program platform.

8. A process for network tracing on a computer graphic display of connected components created according to the process of claim 1 comprising the steps of:
   (a) selecting a connect node on the graphic display for analysis;
   (b) creating a list of the HN numbers for all links physically connected to that node;
   (c) reviewing the connectivity condition of the first link on the list and if determined to be in the "on" condition, placing the link HN in a separate trace list;
   (d) reviewing the connectivity condition of the connected node, and if the in the "on" condition, placing the node HN in the trace list;
   (e) repeating the analysis of steps (b), (c), and (d) for each node-link connection which is in the "on" condition and placing the link and the node HN numbers into the trace list, until all connected links and nodes have been analyzed; and
   (f) highlighting all graphic objects within the trace list.

9. The network tracing process of claim 8 wherein the trace is carried out in an upstream direction.

10. The network tracing process of claim 8 wherein the trace is carried out in a downstream direction.

11. A process for segmenting the network trace of a network display created in conjunction with a computer system connected to a video terminal comprising the steps:
   (a) creating a network comprised of a series of adjacent graphic facets in a manner according to the process of
   (h) inserting a node feature onto a graphic display, and assigning a user ID number to the feature;
   (i) assigning a machine readable entity handle number to the inserted node feature;
   (j) inserting additional node features into said graphic display, and assigning both user ID numbers and machine readable entity handle numbers to each of the inserted features;
   (k) adding linking features between and connecting the inserted nodes;
   (l) selecting the start node of a link and entering the connectivity condition, either open or closed of the node to link connection;
   (m) selecting the end node of a link and entering its connectivity conditions, either open or closed;
   (n) selecting an intermediate point along a link alignment and assigning a link user ID number, and attributes to that point;
   (o) automatically assigning an entity handle number to intermediate point;
   (p) repeating steps (l) through (p) until the network is graphically completely described wherein a new series of ascending hexadecimal numbers is assigned to the entered objects in each of the facets;
   (b) selecting from all of the facets so created, a menu of facets to be connected;
   (c) prompting the computer to establish the connectivity of the selected facets;
   (d) reassigning the HN link and node numbers within each facet in an ascending manner according to the priority position of each individual facet;
   (e) selecting a first node within any of the listed facets and analyzing the connecting links and nodes radiating out and from said first node;
   (f) renumbering the link tags with the newly assigned HN link and node numbers until all link tags within the network of the selected facets have been reassigned;
   (g) performing a trace within the defined network; and
   (h) highlighting the trace as a graphic display on the video screen.

12. A process for inserting a graphic network segment into an already existing graphic network display incorporated into a personal computer/video system comprising the steps of:

(a) creating the to-be inserted graphic network segment on the viedo display of the computer system according to the process of;

(h) inserting a node feature onto a graphic display, and assigning a user ID number to the feature;

(i) assigning a machine readable entity handle number to the inserted node feature;

(j) inserting additional node features into said graphic display, and assigning both user ID numbers and machine readable entity handle numbers to each of the inserted features;

(k) adding linking features between and connecting the inserted nodes;

(l) selecting the start node of a link and entering the connectivity condition, either open or closed of the node to link connection;

(m) selecting the end node of a link and entering its connectivity conditions, either open or closed;

(n) selecting an intermediate point along a link alignment and assigning a link user ID number, and attributes to that point;

(o) automatically assigning an entity handle number to intermediate point;

(p) repeating steps (l) through (p) until the network is graphically completely described (b) assigning a facet number to the created to-be-inserted graphic display;

(c) creating a menu of the facets to be connected;

(d) prompting the computer to establish the connectivity of the selected facets;

(e) reassigning the HN link and node numbers within the facets in an ascending manner according to the priority position on the list of each individual field;

(f) selecting a first node within one of the fields and analyzing the connecting links and nodes radiating out from said first node; and (g) renumbering the link tags with the newly reassigned HN link and node numbers until all link tags within the network of the facets have been reassigned.

13. The process of claim 11 wherein the pointer attributes associated with a graphic object are renumbered accordingly to correspond to the renumbered node and links of the compiled facets.

14. The process of claim 11 wherein a network trace is performed by first selecting a test node.

15. In the process of claim 11 prompting the computer to establish the connectivity of selected facets by using a cursor to place a window around all of the network features to be reconciled.

16. The process of claim 15 wherein the network features to be reconciled are defined by network facets.

17. The process of claim 12 wherein the pointer attributes associated with a graphic object are renumbered accordingly to correspond to the renumbered node and links of the compiled facets.

18. The process of claim 12 wherein a network trace is performed by first selecting a test node.

19. The process of claim 12 prompting the computer to establish the connectivity of selected facets by using a cursor to place a window around all of the network features to be reconciled.

20. The process of claim 19 wherein the network features to be reconciled are defined by network facets.

* * * * *